(12) United States Patent
Ahn et al.

(10) Patent No.: US 7,112,492 B2
(45) Date of Patent: Sep. 26, 2006

(54) METHODS OF FABRICATING SEMICONDUCTOR DEVICES WITH SCALABLE TWO TRANSISTOR MEMORY CELLS

(75) Inventors: Su-Jin Ahn, Seoul (KR); Gwan-Hyeob Koh, Seoul (KR); Hyoung-Joon Kim, Seoul (KR)

(73) Assignee: Samsung Electronics Co. Ltd., (KR)

( * ) Notice: Subject to any disclaimer, the term of this patent is extended or adjusted under 35 U.S.C. 154(b) by 0 days.

(21) Appl. No.: 11/040,229

(22) Filed: Jan. 21, 2005

(65) Prior Publication Data

US 2005/0156225 A1   Jul. 21, 2005

Related U.S. Application Data

(62) Division of application No. 10/763,016, filed on Jan. 22, 2004, now Pat. No. 6,903,409.

(30) Foreign Application Priority Data

May 16, 2003   (KR) ............................... 2003-31302

(51) Int. Cl.
*H01L 21/336* (2006.01)

(52) U.S. Cl. ...................... 438/266; 257/316; 257/319; 257/321

(58) Field of Classification Search ................. 438/266
See application file for complete search history.

(56) References Cited

U.S. PATENT DOCUMENTS 5,427,966 A   6/1995   Komori et al.
5,952,692 A   9/1999   Nakazato et al.
6,475,857 B1*   11/2002   Kim et al. ................... 438/240
2002/0196649 A1*   12/2002   Song et al. ................... 365/63
2003/0032240 A1*   2/2003   Yi et al. ..................... 438/257

FOREIGN PATENT DOCUMENTS

KR   10-2002-0096808   12/2002
KR   10-2003-0013586   2/2003

OTHER PUBLICATIONS

Notice to File a Response/Amendment to the Examination Report for Korean patent application No. 10-2003-0031302 mailed on May 30, 2005.

* cited by examiner

*Primary Examiner*—Tu-Tu Ho
(74) *Attorney, Agent, or Firm*—Myers Bigel Sibley & Sajovec

(57) ABSTRACT

Semiconductor devices having scalable two transistor memory cells, and methods of fabricating the same, are disclosed. The semiconductor devices include a semiconductor substrate having first, second and third isolation layers thereon. The first and second isolation layers are spaced apart to define a first active region therebetween, and the second and third isolation layers are likewise spaced apart to form a second active region therebetween. A cell gate is provided on each active region that includes a gate dielectric layer, a storage node, a multiple tunnel junction barrier and a source layer that are sequentially stacked. The device also includes first and second control lines that surround at least a portion of each sidewall of the cell gates. A dielectric layer may be interposed between the sidewalls of the cell gates and the control line that surrounds it. A data line connects to the cell gates.

20 Claims, 17 Drawing Sheets

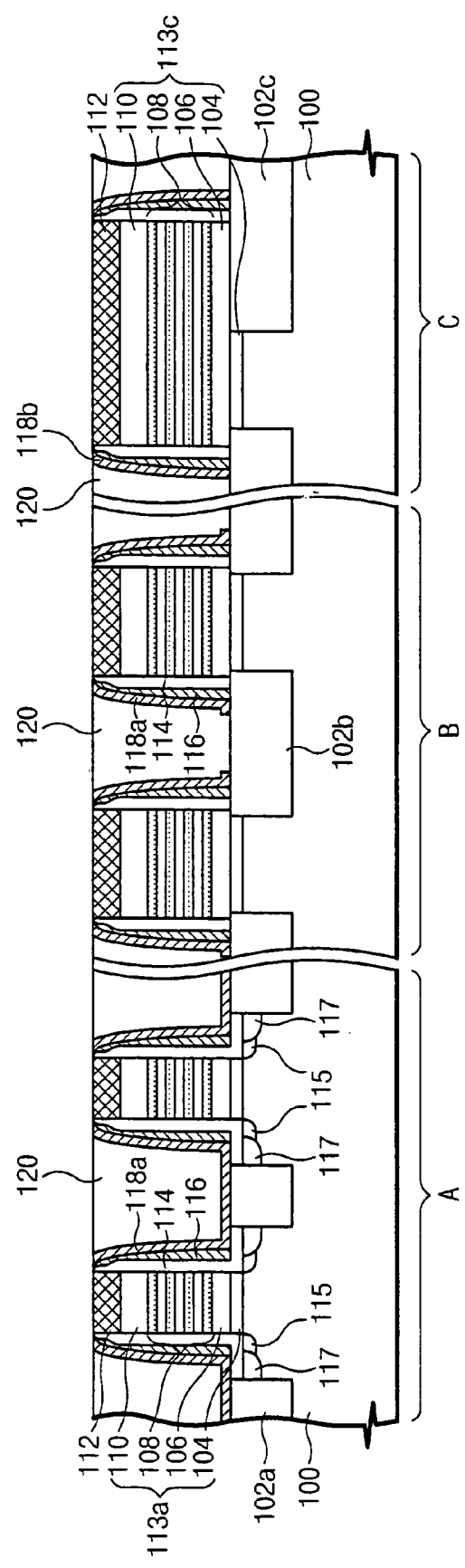

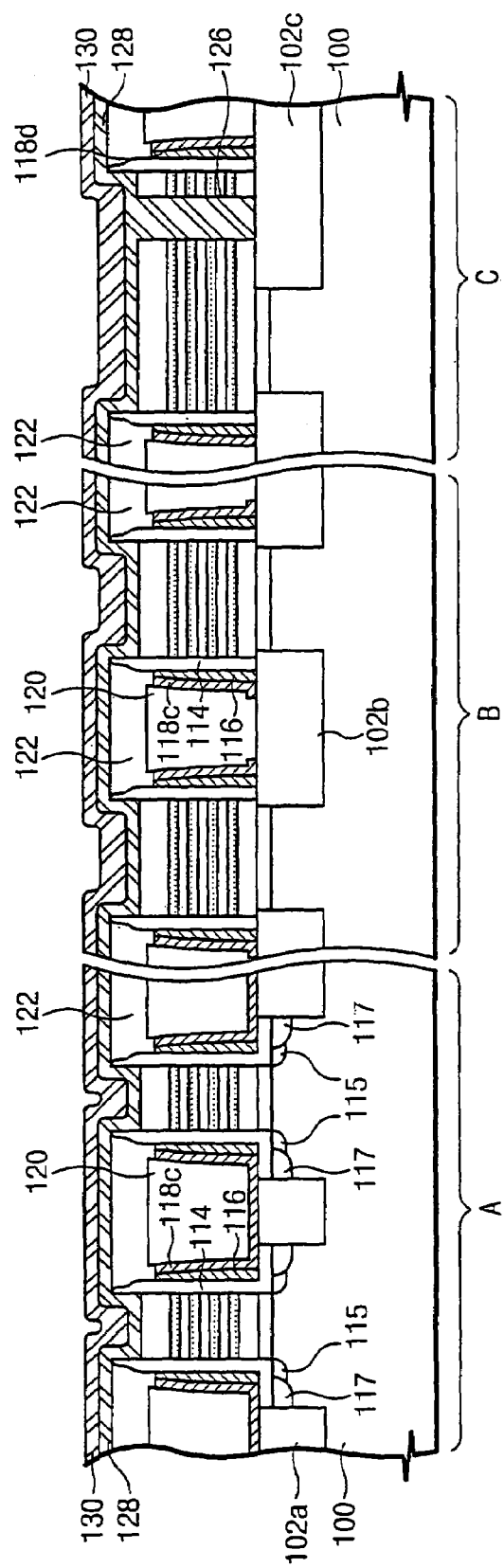

METHODS OF FABRICATING SEMICONDUCTOR DEVICES WITH SCALABLE TWO TRANSISTOR MEMORY CELLS

RELATED APPLICATIONS

This application is a divisional of application Ser. No. 10/763,016, filed Jan. 22, 2004 now U.S. Pat. No. 6,903,409 which itself claims priority under 35 U.S.C. §119 to Korean Patent Application No. 2003-31302, filed May 16, 2003, both of which are assigned to the assignee of the present application, the disclosures of which are incorporated herein in their entirety by reference.

FIELD OF THE INVENTION

The present invention relates to semiconductor memory devices. More particularly, the present invention relates to scalable memory cells and methods of fabricating the same.

BACKGROUND OF THE INVENTION

Dynamic random memory (DRAM) devices can be highly integrated as compared to other memory devices. However, because of leakage currents that result from the high integration, DRAM devices typically must be refreshed periodically in order to retain the stored data. As a result, DRAM devices consume power even in a standby state. In contrast, flash memory devices do not refresh memory cells in order to retain the stored data. However, flash memory devices operate relatively slowly, and a tunneling oxide layer in flash memory device may be damaged in operation.

New memory cells that have the advantages of both the DRAM and the flash memory devices have been studied. One such new memory device is a scalable two transistor memory (STTM) cell which is disclosed by Nakazato et al. in U.S. Pat. No. 5,952,692. The STTM cell may provide high speed, low power consumption and high integration. However, numerous problems may still exist with respect to commercial embodiments of STTM cells.

SUMMARY OF THE INVENTION

Pursuant to embodiments of the present invention, semiconductor devices are provided that include a semiconductor substrate having a first, second and third isolation layers thereon. The first and second isolation layers are spaced apart to define a first active region therebetween, and the second and third isolation layers are likewise spaced apart to form a second active region therebetween. The first, second and third isolation layers may be aligned to form a row.

The device may include a cell gate on each active region. Each cell gate may include a gate dielectric layer, a storage node, a multiple tunnel junction barrier and a source layer that are sequentially stacked. The device also includes first and second control lines. A control line surrounds at least a portion of each sidewall of the cell gates. A dielectric layer may be interposed between the sidewalls of the cell gates and the control line that surrounds it. A data line connects to the cell gates.

The cell gate on the first active region may overlap portions of both the first and second isolation layers. The cell gate on the second active region may overlap a portion of both the second and third isolation layers. Fourth and fifth isolation layers may also be provided on the semiconductor substrate. The fourth and fifth isolation layers may be parallel to the row defined by the first, second and third isolation layers so that the first and second control lines cross over the fourth and fifth isolation layers while the data line crosses over the first, second and third isolation layers.

The device may further include spacers that are interposed at least partially between each dielectric layer and the control line that surrounds it. These spacers may be polysilicon spacers. The device may also include a low-concentration impurity-doped region in the semiconductor substrate under the spacers and a high-concentration impurity-doped region in the semiconductor substrate under the control lines.

In embodiments of the present invention, the top surface of the first and second control lines are lower than a top surfaces of the source layers of the cell arrays. In other embodiments, the top surface of the first and second control lines are higher than a top surfaces of the source layers, and the device may further include an insulation spacer between the first and second control lines and the data line. The insulation spacer may be formed of one material selected from the group consisting of silicon oxide, silicon nitride, silicon oxynitride and aluminum oxide.

Pursuant to further embodiments of the present invention, semiconductor devices are provided that have a set of parallel, spaced apart first isolation layers disposed on a semiconductor substrate. A set of second isolation layers are interposed between adjacent isolation layers in the set of first isolation layers. These devices further include rows of cell gates that are perpendicular to the first isolation layers. Each cell gate may include a gate dielectric layer, a storage node, a multiple tunnel junction barrier and a source layer that are sequentially stacked. The cell gates may be disposed on a portion of two of the second isolation layers.

The devices may further include one or more dielectric layers on the sidewalls of the cell gates and control lines that surround these dielectric layers. A set of data lines that are parallel to the first isolation layers and that connect to cell gates are also provided. The device may also include a peripheral circuit region in the semiconductor substrate that has a third isolation layer that defines an active region in the semiconductor substrate, a peripheral gate that is disposed on both the active region and on a portion of the third isolation layer and a peripheral gate contact plug that electrically connects to the peripheral gate. The peripheral gate includes a gate dielectric layer, a storage node, a multiple tunnel junction barrier and a source layer that are sequentially stacked on the semiconductor substrate.

In further embodiments of the present invention, methods of fabricating semiconductor devices are provided. Pursuant to these methods, a first field isolation layer, a second field isolation layer and a third field isolation layer may be formed on a semiconductor substrate such that the first and second field isolation layers define a first active region therebetween and the second and third field isolation layers define a second active region therebetween. A gate dielectric layer, a storage node layer, a multiple tunnel junction barrier layer and a source layer may be sequentially formed on the semiconductor substrate. The source layer, the multiple tunnel junction barrier layer, the storage node layer and the gate dielectric layer may then be patterned to form a first cell gate and a second cell gate. Each cell gate may have a gate dielectric region, a storage node, a multiple tunnel junction barrier and a source region.

A dielectric layer is formed on the exposed portions of the first and second active regions and on the sidewalls of the first and second cell gates. A first control line may be formed on at least part of each of the sidewalls of the first cell gate and a second control line may be formed on at least part of each of the sidewalls of the second cell gate. A data line is formed perpendicular to the first and second control lines that connects to the source regions of the first and second cell gates.

A mask layer may be formed on the source region. The mask layer may be patterned to form a mask pattern. This mask pattern may be used as an etch mask in the patterning of the source region, the multiple tunnel junction barrier, the storage node and the gate dielectric region. A low-concentration impurity-doped region may be formed in the semiconductor substrate using the first and second cell gates as ion-implantation masks. One or more spacers may then be formed that cover at least a portion of the first and second sidewalls of the cell gates. These spacers may be formed of polysilicon. A high-concentration impurity-doped region may then be formed in the semiconductor substrate using the spacers and the first and second cell gates as ion-implantation masks.

In embodiments of the present invention, the first and second control lines may be formed as follows. First, a conductive layer is formed on at least portions of the dielectric layer. The conductive layer is patterned so that it conformally covers the first and second cell gates. An interlayer dielectric layer is then formed on the patterned conductive layer. This interlayer dielectric layer is then planarized and an upper part of the patterned conductive layer is removed. Finally, part of the patterned conductive layer is removed to form the first and second control lines such that the first and second control lines have a height lower than the height of the source regions.

In other embodiments of the present invention, the first and second control lines are formed by first forming a conductive layer on at least portions of the dielectric layer. The conductive layer is patterned so that it conformally covers the first and second cell gates. An interlayer dielectric layer is then formed on the patterned conductive layer. This interlayer dielectric layer is then etched so that it has a height lower than the top surface of the source regions. A second interlayer dielectric layer is then formed on the first interlayer dielectric layer.

Pursuant to still further embodiments of the present invention, methods of fabricating a semiconductor device are provided in which a set of field isolation layers are formed on a semiconductor substrate that has a cell array region and a peripheral circuit region. The field isolation layers define a set of active regions. A gate dielectric layer is then formed on each of the active regions, and a storage node layer, a multiple tunnel junction barrier layer, a source layer and a mask layer are sequentially formed on the gate dielectric layer. The mask layer is then patterned to form a mask pattern, and the source layer, the multiple tunnel junction barrier layer, the storage node layer and the gate dielectric layer are sequentially patterned using the mask pattern as an etch mask to form a set of cell gates in the cell array region and a peripheral gate in the peripheral circuit region.

A dielectric layer is formed that covers the of active regions and sidewalls of the cell gates and the peripheral gate. A plurality of parallel control lines are then formed, where each control line is formed on a subset of the plurality of cell gates. The mask pattern may be removed, and the source region and the multiple tunnel junction barrier of the peripheral gate are patterned to form a peripheral gate contact hole. A set of data lines may then be formed that are orthogonal to the control lines, where each data line is formed on a subset of the source regions of the cell gates. A peripheral gate contact plug may also be formed in the peripheral gate contact hole.

BRIEF DESCRIPTION OF THE DRAWINGS

FIGS. 3A through 3K are cross-sectional views showing a method of forming the semiconductor device of FIG. 2.

DESCRIPTION OF THE PREFERRED EMBODIMENT

Figure 1:
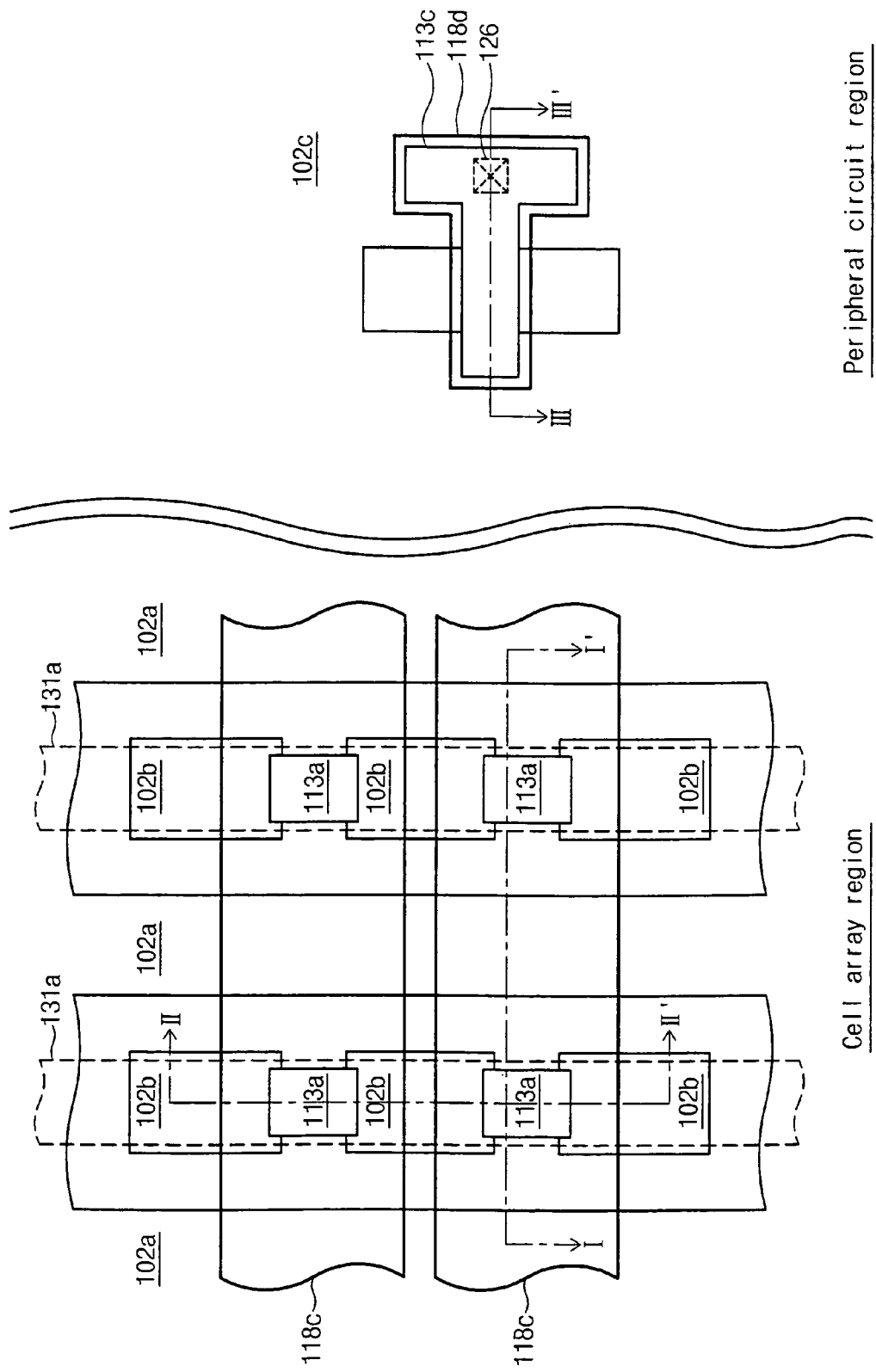
FIG. 1 is a top view of a semiconductor device having scalable two transistor (STTM) cells according to embodiments the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being "on" another element, it can be directly on the other element or layer or intervening elements or layers may also be present. In contrast, if a layer, region or substrate is referred to as being "directly on" another element, then no other intervening layers or elements are present.

Furthermore, relative terms, such as "beneath", may be used herein to describe one element's relationship to another element as illustrated in the figures. It will be understood that relative terms are intended to encompass different orientations of the device in addition to the orientation depicted in the figures. For example, if the device in one of the figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section without departing from the teachings of the present invention. Like numbers refer to like elements throughout. In FIGS. 2 through 7, a reference letter 'A' indicates a cross-sectional view taken along a I–I' line of the semiconductor device of FIG. 1, and another reference letter 'B' indicates a cross-sectional view taken along a II–II' line of the semiconductor device of FIG. 1. Yet another reference letter 'C' indicates a cross-sectional view taken along a III–III' line of the semiconductor device of FIG. 1.

Figure 2:
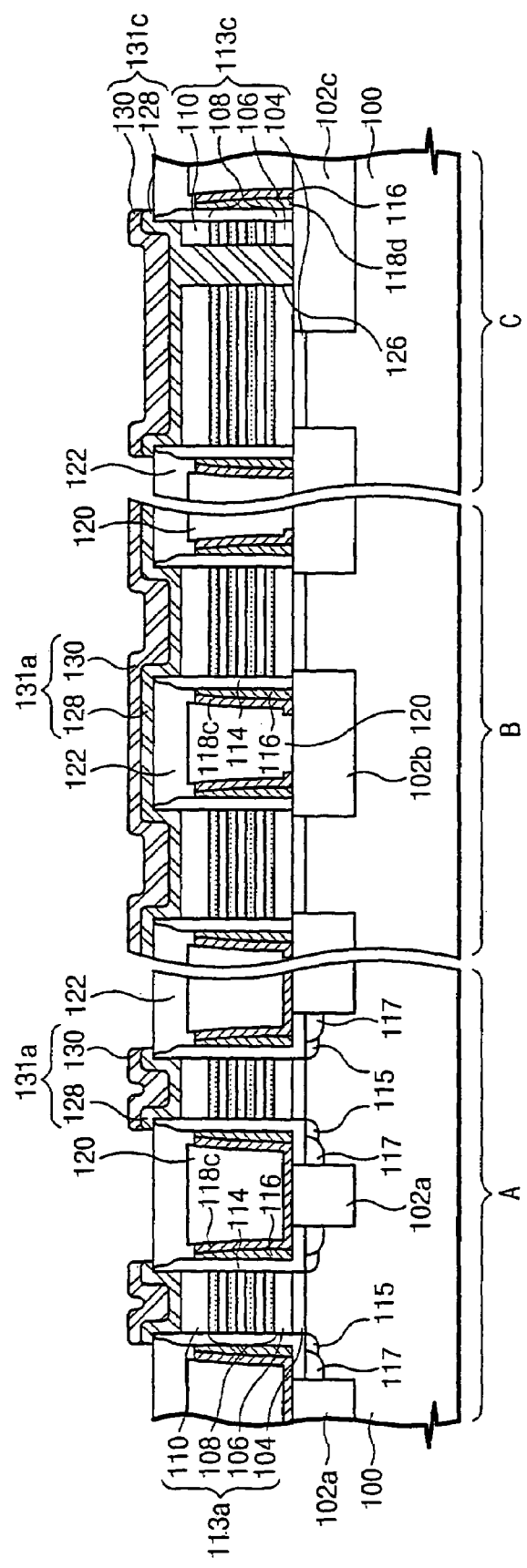
FIG. 2 is a cross-sectional view of a semiconductor device having STTM cells according to embodiments of the present invention.

FIG. 1 is a top view of a cell array region and of a peripheral circuit region of a semiconductor device having scalable two transistor (STTM) cells according to the present invention. FIG. 2 is a cross-sectional view of a semiconductor device such as the semiconductor device of FIG. 1 according to certain embodiments of the present invention.

Referring to FIGS. 1 and 2, a plurality of first field isolation layers 102a and a plurality of second field isolation layers 102b are formed in a cell array region of a semiconductor substrate 100 to define a plurality of active regions therebetween. The first field isolation layers 102a may comprise a plurality of strips in the cell array region of the device that are parallel to each other. Multiple of the second field isolation layers 102b may be disposed in between adjacent the strips that comprise the first field isolation layers 102a. A third field isolation layer 102c may also be provided that defines an active region for a peripheral gate pattern 113c in a peripheral circuit region of the device.

A plurality of cell gates 113a and one or more peripheral gates 113c are provided on the cell array region and the peripheral circuit region, respectively. A cell gate 113a may be provided on each active region in the cell array region. The cell gates 113a may extend beyond its associated active region to overlap with one or more of the second field isolation layers 102b. A peripheral gate 113c may be provided on the active region in the peripheral circuit region. The peripheral gate 113c may extend beyond the active region in the peripheral circuit region to overlap with the third field isolation layer 102c. The cell gates 113a and the peripheral gates 113c may include a gate dielectric layer 104, a storage node 106, a multiple tunnel junction barrier 108 and a source layer 110 that are sequentially stacked from the semiconductor substrate 100. The multiple tunnel junction barrier 108 may include polysilicon layers and silicon nitride layers that are alternatively stacked.

A sidewall gate dielectric layer 114 may be disposed on sidewalls of the cell gates 113a and the peripheral gates 113c and on the active regions, thereby isolating the cell gates 113a and the peripheral gates 113c from a control line 118c. As shown best in FIG. 1, a plurality of control lines 118c may be provided. Sidewalls of the sidewall gate dielectric layer 114 are covered by spacers 116. The control line 118c crosses over the first field isolation layers 102a and covers both the spacers 116 and the active regions in the cell array region. In the peripheral circuit region, the spacer 116 is covered by a peripheral spacer 118d. The peripheral spacer 118d may be composed of the same material as the control line 118c. The control line 118c is covered by a lower interlayer dielectric layer. In certain embodiments of the present invention, the lower interlayer dielectric layer may be formed as a first interlayer dielectric layer 120 and a second interlayer dielectric layer 122 that are sequentially stacked. The first interlayer dielectric layer 120 may have a height similar to the height of the top of the control line 118c. In the peripheral circuit region, a peripheral gate contact hole 126 exposes at least the storage node 106 of the peripheral gate 113c through the source layer 110 and the multiple tunnel junction barrier 108. The peripheral gate contact hole 126 may extend to contact the third field isolation layer 102c.

One of a plurality of data lines 131a connects to the source pattern 110 of each of the cell gates 113a. The data lines 131a are parallel to the first field isolation layers 102a.

The data lines 131a may have a dual layer construction of a conductive layer 128 and a metal silicide layer 130. A peripheral gate contact plug 131c may be provided that is formed of the same material as the data lines 131a to fill the peripheral gate contact hole 126 and simultaneously to cover the peripheral gate 113c.

As shown in FIGS. 1 and 2, one of the control lines 118c surrounds all of the sidewalls of each cell gate 113a. As a result, the semiconductor device may perform program and/or erase operations more quickly than STTM conventional memory devices. Since the control lines 118c do not surround the data lines 131a, it is also possible to decrease coupling between the data lines 131a and the control lines 118c. Additionally, since the peripheral gate contact hole 126 is formed on the field isolation layer 102c, it is possible to reduce and/or minimize damage to the semiconductor substrate 100.

FIGS. 3A through 3K are cross-sectional views showing a method of forming the semiconductor device of FIG. 2.

Figure 3A:
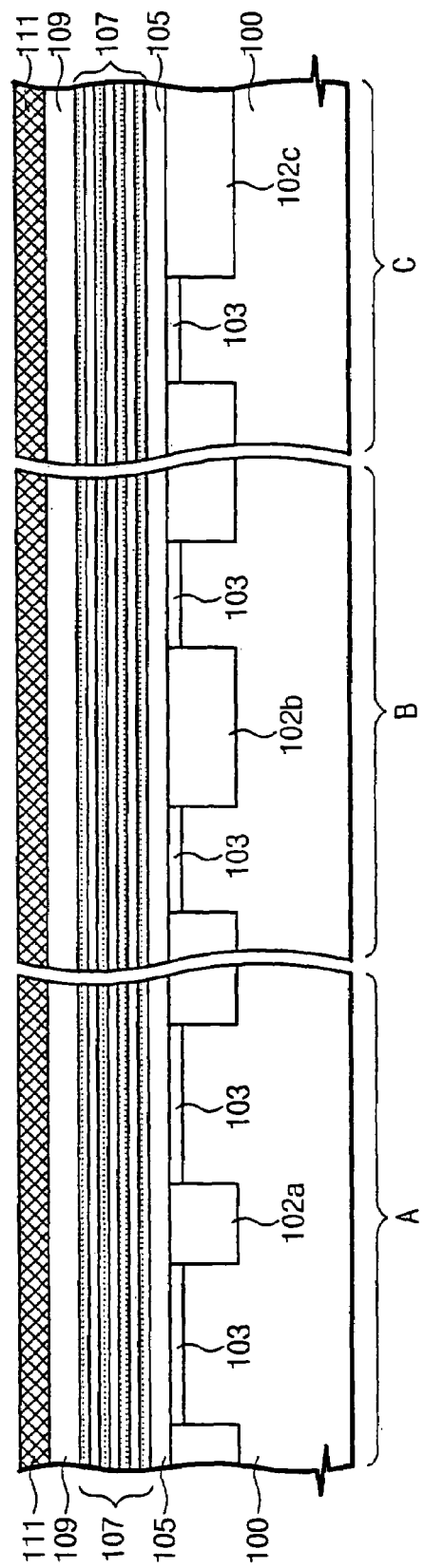

As shown in FIG. 3A, a plurality of field isolation layers 102a, 102b, 102c are formed in a semiconductor substrate 100 to define active regions in both the cell array region and the peripheral circuit region of the semiconductor substrate 100. The field isolation layers 102a, 102b, 102c may be formed using a shallow trench isolation (STI) method. The field isolation layers 102a, 102b, 102c may have a thickness, for example, of about 2500 Å.

A gate dielectric layer 103 may be formed on the active regions defined by the field isolation layers 102a, 102b and 102c. The gate dielectric layer 103 may be formed of a thermal oxide. A storage node layer 105, a multiple tunnel junction barrier layer 107 and a source layer 109 may be sequentially formed on the storage node layer 105. The storage node layer 105 and the source layer 109 may be formed, for example, of an impurity-doped polysilicon. The multiple tunnel junction barrier layer 107 may be formed by alternatively and repeatedly stacking a semiconductor layer having a low band gap and an insulation layer having a high band gap. The semiconductor layer having the low band gap may, for example, be an intrinsic semiconductor layer, an undoped pure semiconductor layer or an impurity-doped semiconductor layer. The semiconductor layer used may, for example, be a silicon layer, a germanium layer, a silicon germanium layer or a silicon germanium carbide layer. The insulation layer having the high band gap may, for example, be a silicon nitride layer, a silicon oxynitride layer, a metal oxide or a metal nitride. A mask layer 111 is formed on the source layer 109. The mask layer 111 may be formed of silicon nitride. An anti-refractive layer (not illustrated) may be formed on the mask layer 111.

Figure 3B:
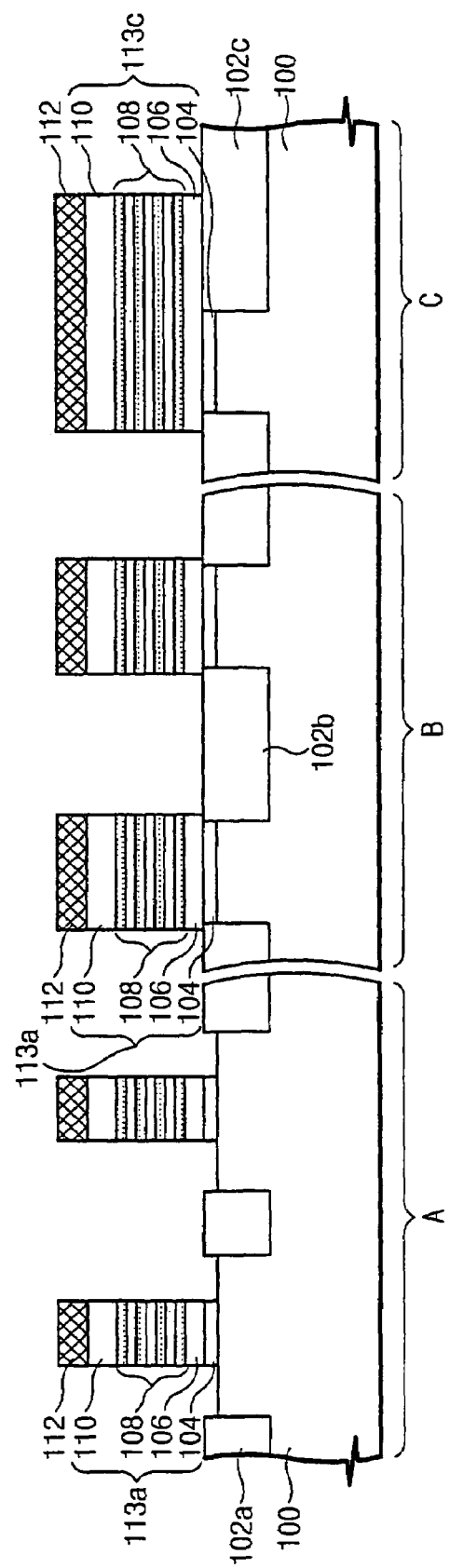

As shown in FIG. 3B, the mask layer 111 may be etched using a photoresist pattern (not illustrated) to form a mask pattern 112. The source layer 109, the multiple tunnel junction barrier layer 107, the storage node layer 105 and the gate dielectric layer 103 may be sequentially patterned using the mask pattern 112 as an etch mask to form a plurality of cell gates 113a in the cell array region and to simultaneously form a peripheral gate 113c in the peripheral circuit region. The cell gates 113a and the peripheral gate 113c may each comprise a gate dielectric layer 104, a storage node 106, a multiple tunnel junction barrier 108 and a source pattern 110 that are sequentially stacked on the semiconductor substrate 100.

Figure 3C:
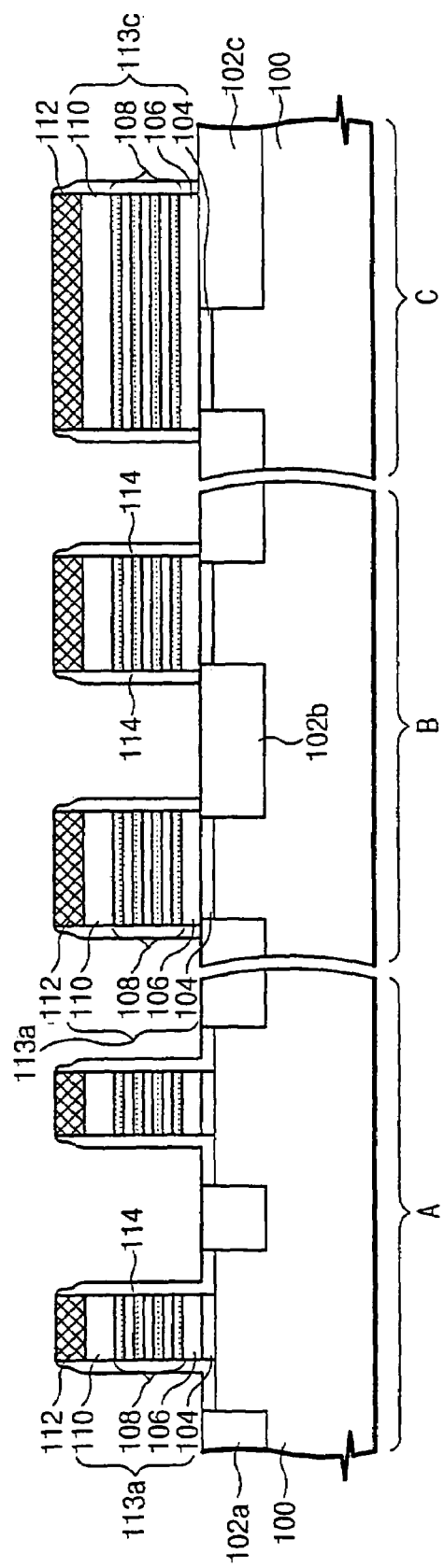

As shown in FIG. 3C, a sidewall gate dielectric layer 114 may be formed to cover both the active regions in the semiconductor substrate 100 and the sidewalls of the cell gates 113a and the peripheral gates 113c. The sidewall gate dielectric layer 114 may be formed of thermal oxide by performing a thermal process in an oxygen ambient. The sidewall gate dielectric layer 114 may also be formed to cover sidewalls of the mask pattern 112. The sidewall gate dielectric layer 114 may be formed of a single layer or multiple layers of at least one material selected from a group consisting of silicon oxide, silicon nitride, silicon oxynitride, metal oxide and metal nitride. The sidewall gate dielectric layer 114 may be formed, for example, using a chemical vapor deposition (CVD) technique.

Figure 3D:
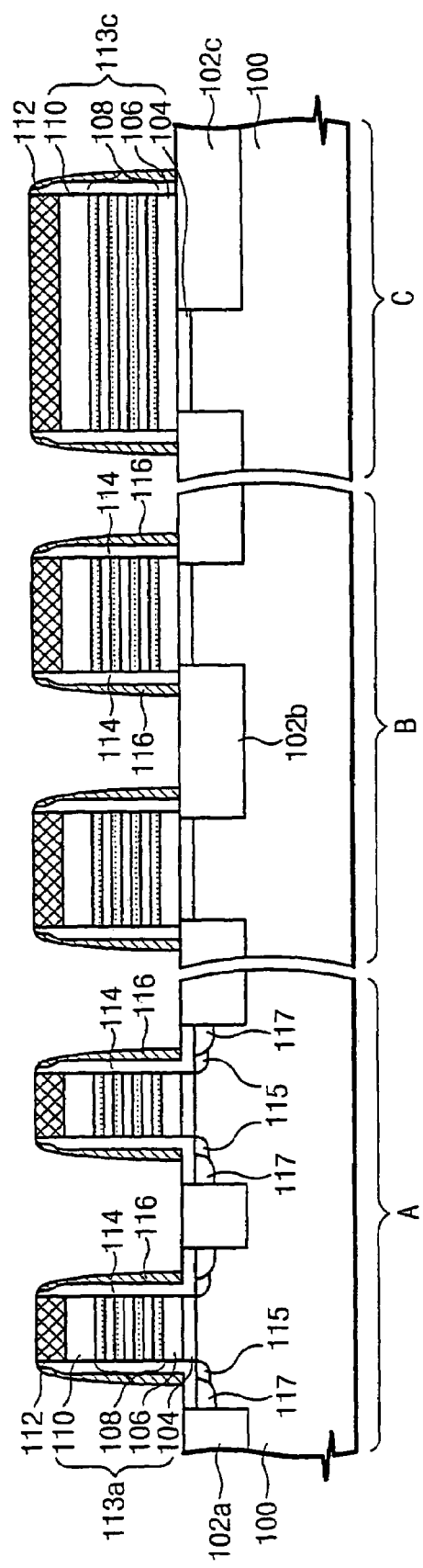

As shown in FIG. 3D, a low-concentration impurity-doped region 115 may be formed in the semiconductor substrate 100 by using the cell gates 113a and the peripheral gate 113c as ion implementation masks. A layer such as, for example, a polysilicon layer may then be conformally formed on the semiconductor substrate 100. The polysilicon layer may be anisotropically etched to form spacers 116 that cover the sidewalls of the cell gates 113a, the peripheral gate 113c and the mask pattern 112. A high-concentration impurity-doped region 117 may be formed in the semiconductor substrate 100 by using the cell gates 113a, the peripheral gate 113c and the spacers 116 as ion-implantation masks. The type of impurity implanted in the ion-implantation process may be varied based upon desired process design rules. The impurities selected may, for example, be chosen from a group consisting of phosphorus, arsenic and boron.

Figure 3E:
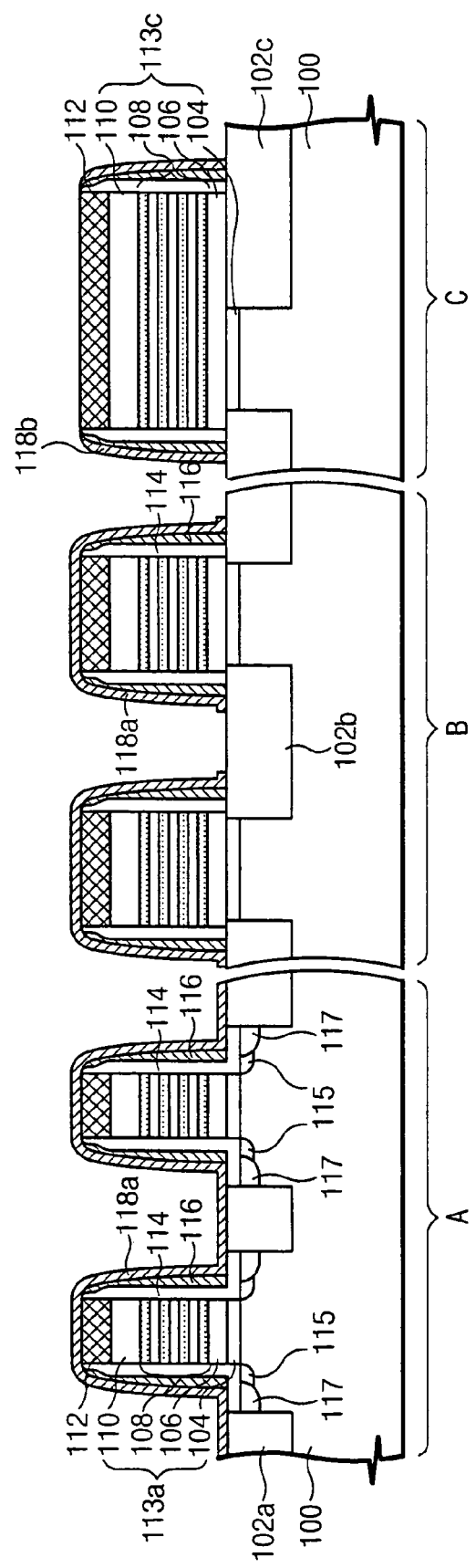

Referring to FIG. 3E, an undoped polysilicon layer or a polysilicon layer doped with impurities or another type of conductive layer may be conformally formed on the semiconductor substrate 100. This layer may then be patterned to form a plurality of preliminary control lines 118a that cover sidewalls of the sidewall gate dielectric layer 114 in the cell array region and that cross over the first field isolation layers 102a. This patterning process may also be used to form preliminary peripheral spacers 118b that cover sidewalls of the spacer 116 provided in the peripheral circuit region. The plurality of the preliminary control lines 118a are generally parallel to each other.

Referring to FIG. 3F, a first interlayer dielectric layer 120 may then be formed on the semiconductor substrate 100 having the preliminary control lines 118a and the preliminary peripheral spacers 118b. A chemical mechanical polishing (CMP) process may be performed with respect to the first interlayer dielectric layer 120 to remove a part of the first interlayer dielectric layer 120 and an upper part of the preliminary control line 118a so as to expose the mask pattern 112, the preliminary control line 118a, the spacers 116 and the preliminary peripheral spacers 118b.

Figure 3G:
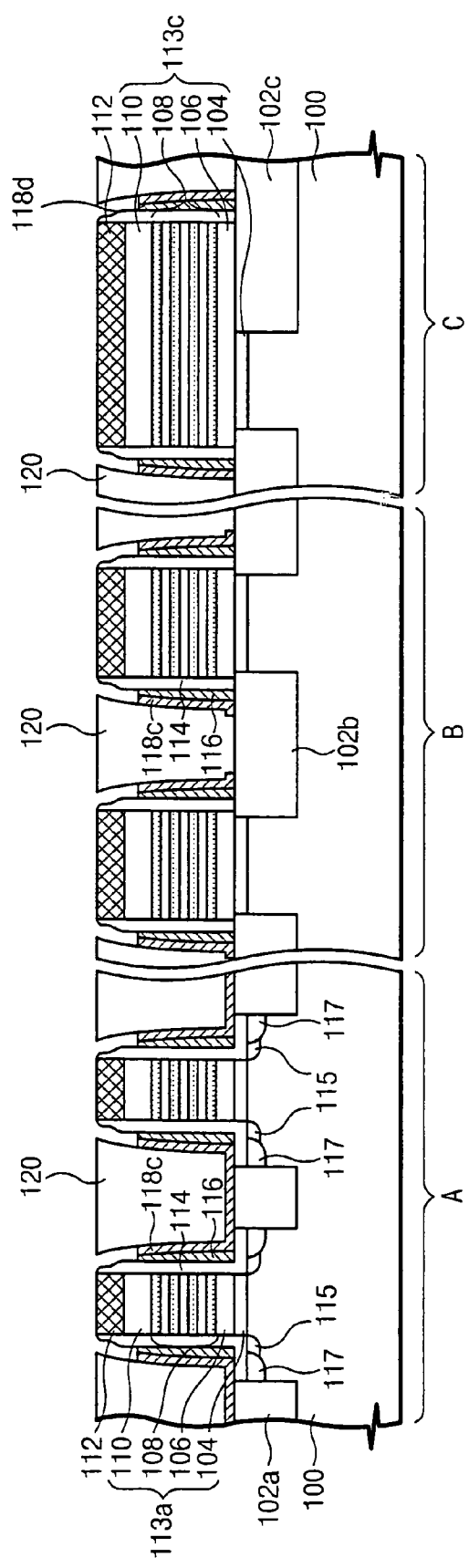

As shown in FIG. 3G, the preliminary control line 118a, the preliminary peripheral spacer 118b and the spacer 116 may be partially wet-etched to expose the part of the sidewall gate dielectric layer 114 that covers sidewalls of the mask pattern 112 and the source pattern 110. This wet etch process may also be used to simultaneously convert the preliminary control line 118a into a control line 118c that partially covers each sidewall of the cell gates 113a and a peripheral spacer 118d that partially covers each sidewall of the peripheral gate 113c. The wet-etch process may be performed by using a wet-etch solution including fluoric acid (HF). If the preliminary control line 118a, the preliminary peripheral spacers 118b and the spacers 116 are formed of polysilicon, all of the layers 118a, 118b and 116 may be simultaneously wet-etched. The high-concentration impurity-doped regions 117 are source/drain regions and may be used as a bit line and a sensing line.

Figure 3H:
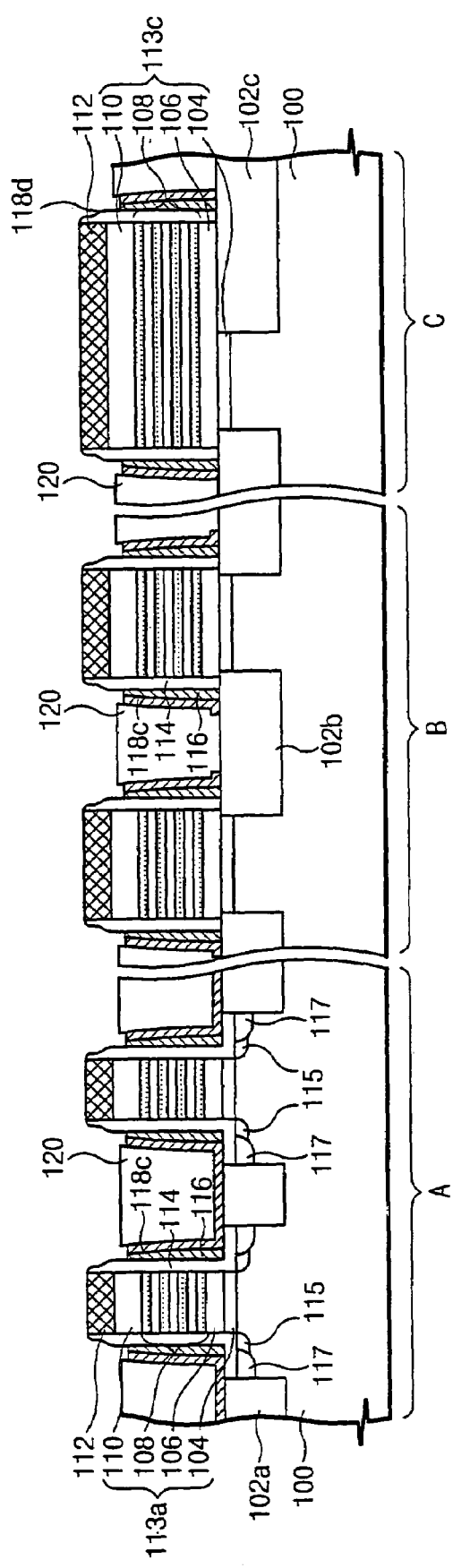

As illustrated in FIG. 3H, an etch-back process may be performed with respect to the first interlayer dielectric layer 120 to adjust the height of the first interlayer dielectric layer 120 to be similar to the height of the control line 118c. The etch-back process may be performed, for example, using a gas including fluorine. The anti-refractive layer, which may be formed as noted above in the discussion of FIG. 3A, may be removed in the etch-back process.

Figure 3I:
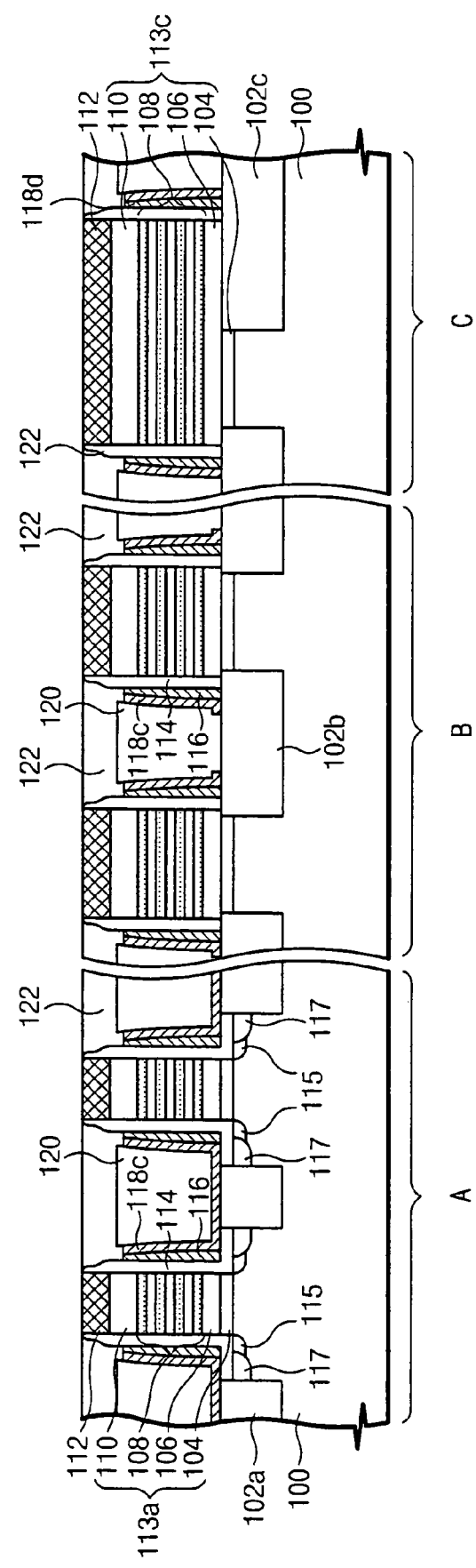

Referring to FIG. 3I, a second interlayer dielectric layer 122 may be formed on the semiconductor substrate 100 and planarized by a CMP process to expose the mask pattern 112. The first and second interlayer dielectric layers 120 and 122 together comprise a lower interlayer dielectric layer. The first second interlayer dielectric layers 120, 122 may be formed of the same material.

Figure 3J:
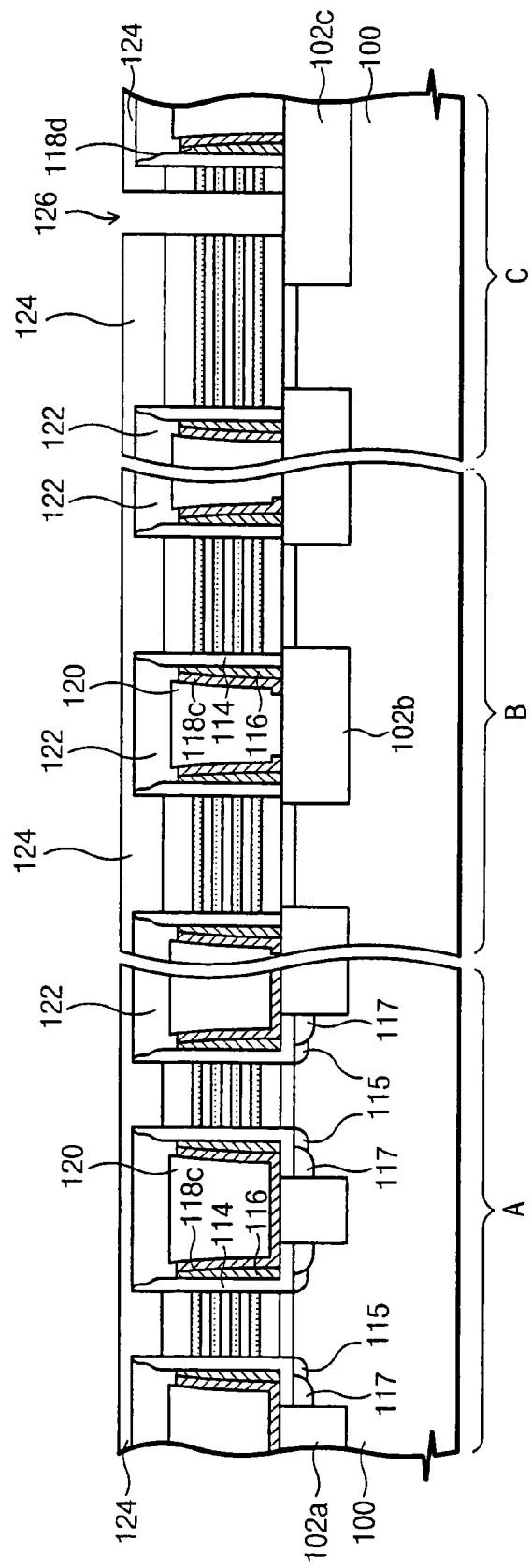

As shown in FIG. 3J, the mask pattern 112 may be removed to expose the source layers 110. A photoresist pattern 124 may be formed to expose a part of the source layer 110 on the third field isolation layer 102c at the peripheral circuit region. At least the source layer 110 and the multiple tunnel junction barrier 108 are patterned to form a peripheral gate contact hole 126 at the peripheral circuit region by using the photoresist pattern 124. During the patterning process, the storage node 106 and the gate dielectric layer 104 may be over-etched to expose the third field isolation layer 102c.

As shown in FIG. 3K, the photoresist pattern 124 may then be removed. A conductive layer 128 and a metal silicide layer 130 may be sequentially formed on the the semiconductor substrate 100, filling the peripheral gate contact hole 126. The metal silicide layer 130 and the conductive layer 128 may be sequentially patterned to form a plurality of data lines 131a in the cell array region and simultaneously to form a peripheral gate contact plug 131c in the peripheral circuit region.

In a subsequent process, an upper interlayer dielectric layer may be formed on the data lines 131a and the peripheral gate contact plug 131c. A peripheral via plug is formed to electrically connect to the peripheral gate contact plug 131c through the upper interlayer dielectric layer in the peripheral circuit region. A cell via plug may be formed to connect to the control lines 118c through the upper interlayer dielectric layer and the lower interlayer dielectric layer in the cell array region.

In the above-described methods for forming the semiconductor device, the field isolation layers 102a, 102b and 102c may be formed by a general STI method. The cell gates 113a are formed before the data lines 131a are formed, allowing the cell gates 131a to be precisely formed. The cell gates 113a may be formed on the second field isolation layers 102b, thereby reducing and/or minimizing etch damage to the semiconductor substrate 100. The spacers 116 may be formed of polysilicon to protect the multiple tunnel junction barriers 108. The peripheral gate contact hole 126 may be formed on the third field isolation layer 102c to reduce and/or minimize etch damage to the semiconductor substrate 100. These features of embodiments of the present invention may provide STTM cells having improved reliability.

Figure 4:
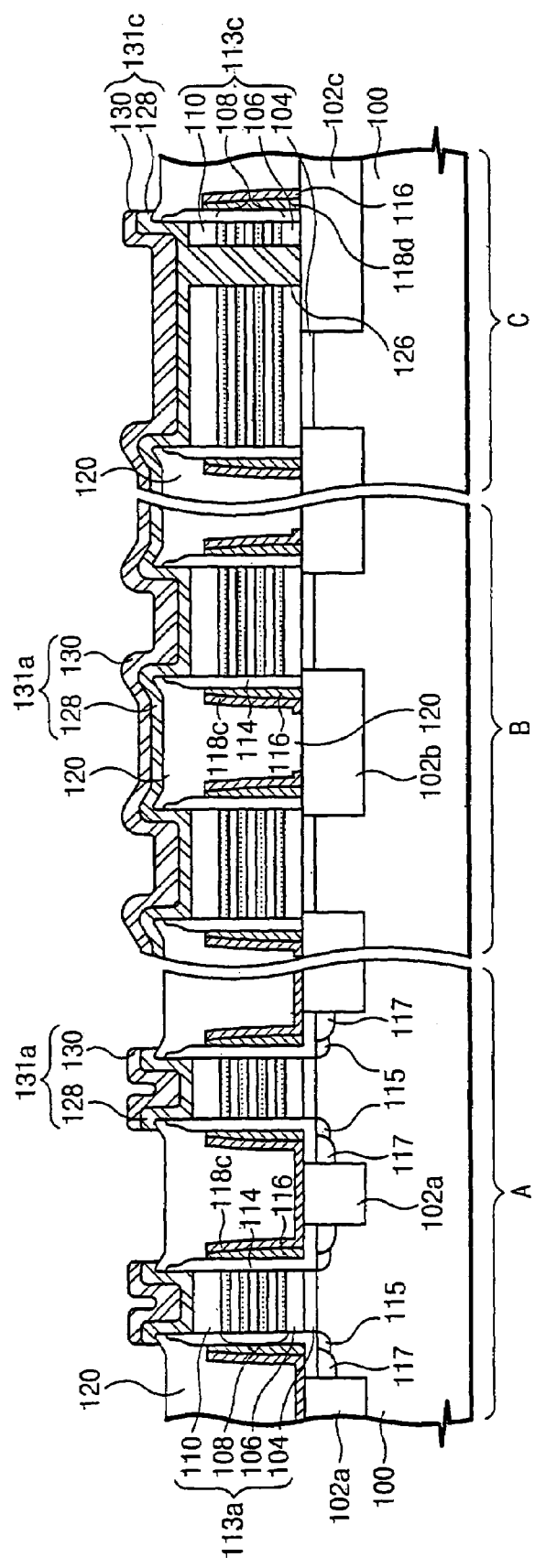
FIG. 4 is a cross-sectional view of a semiconductor device having STTM cells according to additional embodiments of the present invention.

FIG. 4 is a cross-sectional view of a semiconductor device having STTM cells according to further embodiments of the present invention. In the embodiment of the present invention shown in FIG. 4, the lower interlayer dielectric layer, is formed of a single layer, namely the first interlayer dielectric layer 120. Additionally, the lower interlayer dielectric layer is partially protruded at the upper side of the cell gates 113a and the peripheral gate 113c. Other features may be identical to the features of the device of FIG. 2.

Figure 5:
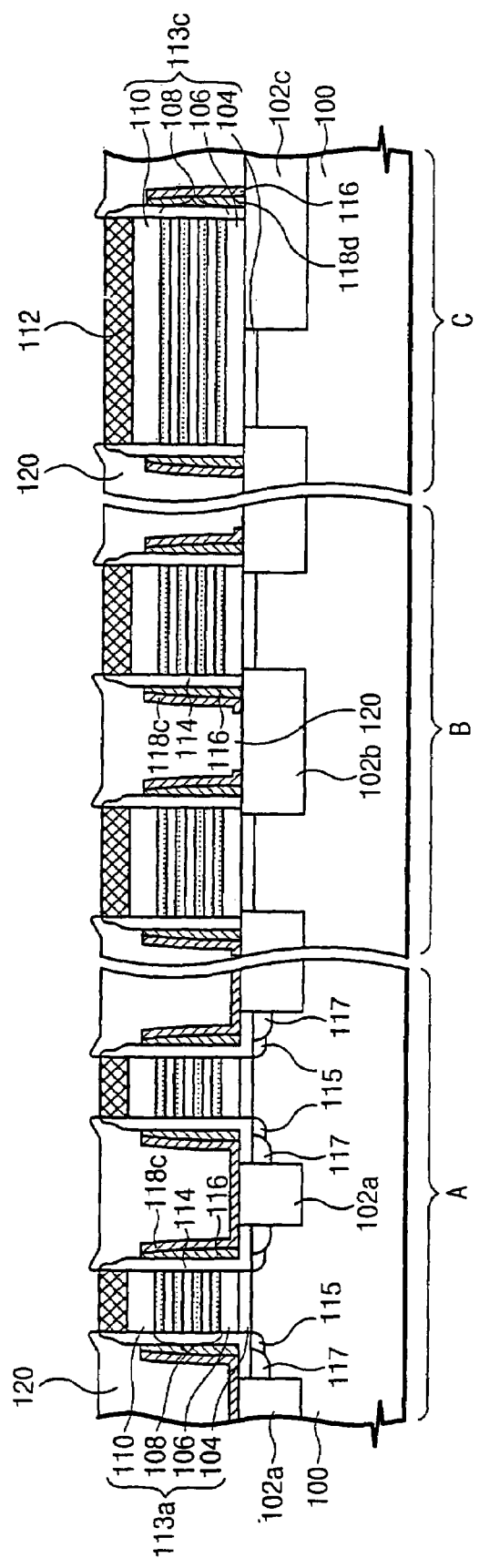
FIG. 5 is a cross-sectional view showing a method of forming the semiconductor device of FIG. 4.

FIG. 5 is a cross-sectional view illustrating a method of forming the semiconductor device of FIG. 4. The device of FIG. 5 may be formed following the steps discussed above with respect to FIGS. 3A and 3E.

As shown in FIG. 5, upper parts of the preliminary control line 118a, the spacer and the preliminary peripheral spacers 118b are oxidized. The oxidizing rate is controlled to form a control line 118c, spacers 116 and peripheral spacers 118d, that have a lower height than the cell gates 113a. Upper parts of the first interlayer dielectric layer 120 may be protruded due to the oxidation of the upper parts of the preliminary control line 118a, the spacers 116 and the preliminary peripheral spacer 118b. In a subsequent process, the mask pattern 112 may be removed and the semiconductor device of FIG. 4 may be formed via the steps of FIGS. 3J through 3K. Other process conditions, and kinds and thicknesses of other layers may be identical to those discussed above with respect to the semiconductor device of FIG. 2.

Figure 6:
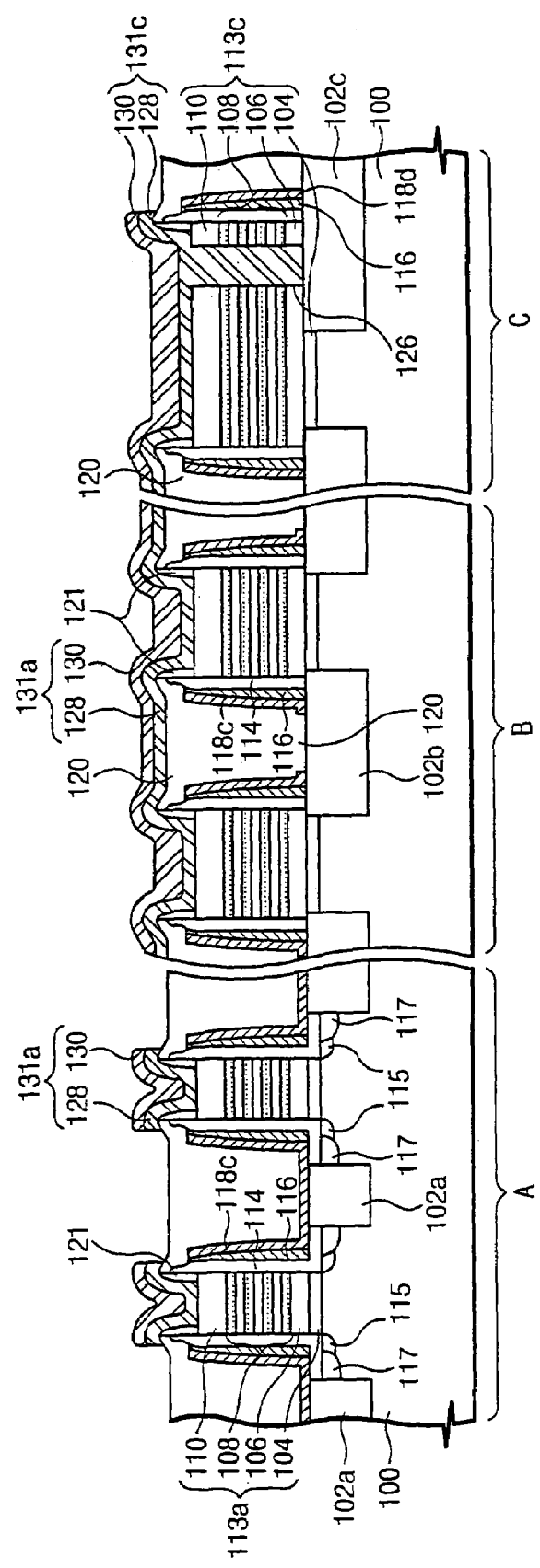
FIG. 6 is a cross-sectional view of a semiconductor device having STTM cells according to still further embodiments of the present invention.

FIG. 6 is a cross-sectional view of a semiconductor device having STTM cells according to still further embodiments of the present invention.

In the embodiment of the present invention shown in FIG. 6, the lower interlayer dielectric layer is formed of a single layer, namely the first interlayer dielectric layer 120. In this embodiment, the top surface of spacers 116, the control lines 118c and the peripheral spacers 118d are higher than the top surface of the cell gates 113a and the peripheral gate 113c. Insulation spacers 121 are provided for covering sidewalls of the first interlayer dielectric layer 120 and upper sidewalls of the spacer 116 to isolate the data lines 131a from the control lines 118c. Other features of the device may be identical to the corresponding features in the embodiment of the present invention depicted in FIG. 4.

Figure 7:
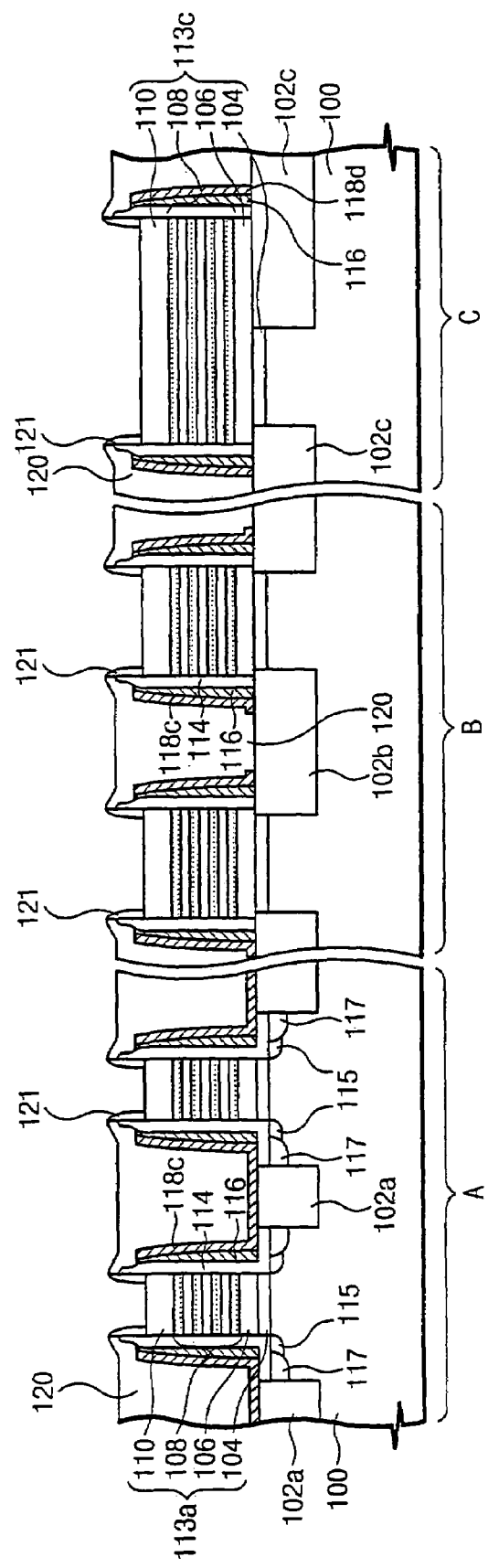
FIG. 7 is a cross-sectional view showing a method of forming the semiconductor device of FIG. 6.

FIG. 7 is a cross-sectional view showing a method of forming the semiconductor device of FIG. 6. The device of FIG. 7 may be formed, for example, following the steps discussed above with respect to FIGS. 3A through 3E.

As shown in FIG. 7 upper parts of the preliminary control line 118a, the spacers and the preliminary peripheral spacers 118b are oxidized. The oxidizing rate is controlled to form a control line 118c, spacers 116 and peripheral spacers 118d, which have a higher height than the cell gates 113a. The mask pattern 112 may then be removed. An insulation layer may be conformally formed and anisotropically etched on the semiconductor substrate 100 to form insulation spacers 121 on sidewalls of the first interlayer dielectric layer 120 and upper sidewalls of the spacer 116. The insulation spacers 121 may be formed, for example, of one material selected from the group consisting of silicon oxide, silicon nitride, silicon oxynitride, and/or aluminum oxide. Other features of the device may be identical to the corresponding features in the embodiment of the present invention depicted in FIG. 2.

The semiconductor devices having STTM cells according to embodiments of the present invention may perform program and/or erase operations faster than conventional technology. The control lines may surround at least a portion of all of the sidewalls of the cell gates, thereby enlarging the channel. The control lines do not surround the data lines, which may decrease coupling between the data lines and the control lines. The cell gates may be formed before the data lines are formed, which may facilitate precise formation of the cell gates. The cell gates may be partially formed on the field isolation layers to alleviate etch damage to the semiconductor substrate. The spacers may be formed of polysilicon to protect the multiple tunnel junction barrier pattern. A peripheral gate contact hole may be formed on the field isolation layer in a manner that endures etch damage to the semiconductor substrate. These features may improve the reliability of the semiconductor device having STTM cells.

Pursuant to further embodiments of the present invention, semiconductor devices are provided that comprise a semiconductor substrate, a plurality of first field isolation layers that are parallel to each other and that cross over the substrate, a plurality of second field isolation layers that are interposed between the first field isolation layers and spaced from each other in a row along the first field isolation layers, a plurality of cell gate patterns being partially overlapped with the second field isolation layers on the semiconductor substrate between the second field isolation layers, a plurality of control lines that are parallel to each other and that cross over the first field isolation layers and surrounding sidewalls of the cell gate patterns, sidewall gate dielectric layers that are interposed between the control lines and the cell gate patterns, and a plurality of data lines that are parallel to each other and to the first field isolation layers and that connect to top surfaces of the cell gate patterns.

The cell gate patterns may comprise a gate dielectric pattern, a storage node pattern, a multiple tunnel junction barrier pattern and a source pattern that are sequentially stacked from the semiconductor substrate. The devices may further include a polysilicon or other spacer interposed between the sidewall gate dielectric layer and the control line. The device may also have a low-concentration impurity-doped region in the substrate under the spacers and/or a high-concentration impurity-doped region in the substrate under the control lines.

The semiconductor substrate may further include a third field isolation layer that defines an active region in a peripheral circuit region of the semiconductor substrate. A peripheral gate pattern may be provided on the active region in the peripheral circuit region and on portions of the third field isolation layer. The peripheral gate pattern may include a gate dielectric pattern, a storage node pattern, a multiple tunnel junction barrier pattern and a source pattern sequentially stacked from the semiconductor substrate. A peripheral gate contact plug may also be provided for electrically connecting to the peripheral gate pattern. The peripheral gate contact plug may be connected to the storage node pattern through the source pattern and the multiple tunnel junction barrier pattern. The semiconductor device may further include a sidewall gate dielectric layer and a spacer covering sidewalls of the peripheral gate pattern.

What is claimed is:

1. A method of fabricating a semiconductor device, comprising:

forming a first field isolation layer, a second field isolation layer and a third field isolation layer on a semiconductor substrate, the first and second field isolation layers defining a first active region therebetween and the second and third field isolation layers defining a second active region therebetween;

sequentially forming a gate dielectric layer, a storage node layer, a multiple tunnel junction barrier layer and a source layer on the semiconductor substrate;

forming a mask layer directly on the source layer;

patterning the mask layer to form a mask pattern;

patterning the source layer, the multiple tunnel junction barrier layer, the storage node layer and the gate dielectric layer using the mask pattern as an etch mask to form a first cell gate and a second cell gate, the first and second cell gates each having a gate dielectric region, a storage node, a multiple tunnel junction barrier and a source region that are sequentially stacked on the semiconductor substrate;

forming a dielectric layer on the exposed portions of the first and second active regions and on the sidewalls of the first and second cell gates;

forming a first control line on at least a portion of each of the sidewalls of the first cell gate;

forming a second control line on at least a portion of each of the sidewalls of the second cell gate-, wherein the second control line is parallel to the first control line; and forming a data line perpendicular to the first and second control lines and connecting to the source regions of the first and second cell gates.

2. The method of claim 1, further comprising:

forming a low-concentration impurity-doped region in the semiconductor substrate using the first and second cell gates as ion-implantation masks;

forming one or more spacers to cover at least a portion of the first and second sidewalls of the cell gates; and forming a high-concentration impurity-doped region in the semiconductor substrate using the spacers and the first and second cell gates as ion-implantation masks.

3. The method of claim 2, wherein the spacers are formed of polysilicon.

4. The method of claim 1, wherein forming the first and second control lines comprises:

forming a conductive layer on at least portions of the dielectric layer;

patterning the conductive layer so that the conductive layer conformally covers the first and second cell gates;

forming an interlayer dielectric layer on the patterned conductive layer;

planarizing the interlayer dielectric layer and removing an upper part of the patterned conductive layer; and removing a part of the patterned conductive layer to form the first and second control lines, wherein the first and second control lines have a height lower than the height of the source regions.

5. The method of claim 1, wherein forming the first and second control lines comprises:

forming a conductive layer on at least portions of the dielectric layer;

patterning the conductive layer so that the conductive layer conformally covers the first and second cell gates;

forming a first interlayer dielectric layer on the patterned conductive layer;

etching the first interlayer dielectric layer so that the interlayer dielectric layer has a height lower than the top surface of the source regions; and forming a second interlayer dielectric layer on the first interlayer dielectric layer.

6. The method of claim 1, wherein a first height of a bottom surface of the data line above a top surface of the semiconductor substrate exceeds a second height of the first control line above the top surface of the semiconductor substrate.

7. The method of claim 4, wherein removing a part of the patterned conductive layer to form the first and second control lines comprises oxidizing a part of the patterned conductive layer.

8. The method of claim 1, wherein forming the first and second control lines comprises:

forming a conductive layer on at least portions of the dielectric layer;

patterning the conductive layer so that the conductive layer conformally covers the first and second cell gates;

forming an interlayer dielectric layer on the patterned conductive layer;

planarizing the interlayer dielectric layer and removing an upper part of the patterned conductive layer; and oxidizing a part of the patterned conductive layer to form the first and second control lines, wherein the first and second control lines have a height higher than the height of the source regions-.

9. A method of fabricating a semiconductor device, comprising:

forming a first field isolation layer, a second field isolation layer and a third field isolation layer on a semiconductor substrate, the first and second field isolation layers defining a first active region therebetween and the second and third field isolation layers defining a second active region therebetween;

sequentially forming a gate dielectric layer, a storage node layer, a multiple tunnel junction barrier layer and a source layer on the semiconductor substrate;

patterning the source layer, the multiple tunnel junction barrier layer, the storage node layer and the gate dielectric layer to form a first cell gate and a second cell gate, the first and second cell gates each having a gate dielectric region, a storage node, a multiple tunnel junction barrier and a source region that are sequentially stacked on the semiconductor substrate;

forming a dielectric layer on the exposed portions of the first and second active regions and on the sidewalls of the first and second cell gates;

forming a first control line on at least a portion of each of the sidewalls of the first cell gate;

forming a second control line on at least a portion of each of the sidewalls of the second cell gate, wherein the second control line is parallel to the first control line; and forming a data line perpendicular to the first and second control lines and connecting to the source regions of the first and second cell gates, wherein the first cell gate is formed so that a first part of the first cell gate is formed on the first field isolation layer and a second part of the first cell gate is formed on the second field isolation layer, and wherein the second cell gate is formed so that a first part of the second cell gate is formed on the second field isolation layer and a second part of the second cell gate is formed on the third field isolation layer.

10. The method of claim 1, wherein the data line is formed after the first and second cell gates.

11. A method of fabricating a semiconductor device, comprising:

forming a plurality of field isolation layers on a semiconductor substrate having a cell array region and a peripheral circuit region to define a plurality of active regions;

forming a gate dielectric layer on the plurality of active regions;

sequentially forming a storage node layer, a multiple tunnel junction barrier layer, a source layer and a mask layer on the gate dielectric layer;

patterning the mask layer to form a mask pattern;

sequentially patterning the source layer, the multiple tunnel junction barrier layer, the storage node layer and the gate dielectric layer using the mask pattern as an etch mask to form a plurality of cell gates in the cell array region and a peripheral gate in the peripheral circuit region, the cell gates and the peripheral gate each having a gate dielectric region, a storage node, a multiple tunnel junction barrier and source region;

forming a dielectric layer covering the plurality of active regions and sidewalls of the cell gates and the peripheral gate;

forming a plurality of parallel control lines, wherein each control line is formed on a subset of the plurality of cell gates;

removing the mask pattern;

patterning the source region and the multiple tunnel junction barrier of the peripheral gate to form a peripheral gate contact hole;

forming a plurality of parallel data lines that are orthogonal to the plurality of control lines, wherein each data line is formed on a subset of the source regions of the cell gates; forming a peripheral gate contact plug in the peripheral gate contact hole.

12. The method of claim 11, before forming the control lines, further comprising:

forming a plurality of low-concentration impurity-doped regions in the semiconductor substrate using the cell gates and the peripheral gate as ion-implantation masks;

forming a plurality of spacers on sidewalls of the cell gates and the peripheral gate; and forming a plurality of high-concentration impurity-doped regions in the semiconductor substrate using the spacers, the cell gates and the peripheral gate as ion-implantation masks.

13. The method of claim 12, wherein the spacers comprise polysilicon spacers.

14. The method of claim 11, wherein forming the plurality of control lines comprises:

forming a conductive layer on at least portions of the dielectric layer;

patterning the conductive layer using a photoresist pattern so that the conductive layer conformally covers the plurality of cell gates;

forming an interlayer dielectric layer on the patterned conductive layer;

planarizing the interlayer dielectric layer and removing an upper part of the patterned conductive layer to expose the mask pattern; and removing a part of the patterned conductive layer to form the plurality of control lines, wherein the control lines have a height lower than the height of the source regions of the cell gates.

15. The method of claim 14, wherein removing a part of the patterned conductive layer to form the plurality of control lines comprises oxidizing a part of the patterned conductive layer.

16. The method of claim 14, further comprising:

performing an anisotropic etch process with respect to the first interlayer dielectric layer to form the first interlayer dielectric layer having a height lower than a bottom of the mask pattern; and stacking and planarizing a second interlayer dielectric layer to expose the mask pattern.

17. The method of claim 11, wherein the forming control lines comprises:

forming a conductive layer on at least portions of the dielectric layer;

patterning the conductive layer so that the conductive layer conformally covers the plurality of cell gates in the cell array region;

forming an interlayer dielectric layer on the patterned conductive layer;

planarizing the interlayer dielectric layer and removing an upper part of the patterned conductive layer to expose the mask pattern; and oxidizing a part of the patterned conductive layer to form the plurality of control lines, wherein the control lines have a height higher than the height of the source regions of the cell gates.

18. The method of claim 14, further comprising forming an insulation spacer covering sidewalls of the first interlayer dielectric layer and protruded upper sidewalls of the control lines after removing the mask pattern.

19. The method of claim 18, wherein the insulation spacer is formed of one material selected from the group consisting of silicon oxide, silicon nitride, silicon oxynitride and aluminum oxide.

20. The method of claim 13, wherein the data lines and the peripheral gate contact plug are simultaneously formed.

* * * * *